United States Patent
Kollmer et al.

(10) Patent No.: US 6,870,373 B2
(45) Date of Patent: Mar. 22, 2005

(54) CIRCUIT CONFIGURATION AND METHOD FOR ASSESSING CAPACITANCES IN MATRICES

(75) Inventors: Ute Kollmer, Munich (DE); Stephan Sauter, Munich (DE); Carsten Linnenbank, Munich (DE); Roland Thewes, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 349 days.

(21) Appl. No.: 10/236,889

(22) Filed: Sep. 6, 2002

(65) Prior Publication Data

US 2003/0062905 A1 Apr. 3, 2003

Related U.S. Application Data

(63) Continuation of application No. PCT/DE01/00626, filed on Feb. 16, 2001.

(30) Foreign Application Priority Data

Mar. 6, 2000 (DE) .......................................... 100 10 888

(51) Int. Cl.$^7$ .......................... G01R 31/11; G01R 27/26
(52) U.S. Cl. .......................... 324/534; 324/678; 324/683
(58) Field of Search ................................. 324/534, 658, 324/676, 678, 681, 683

(56) References Cited

U.S. PATENT DOCUMENTS 4,728,932 A    3/1988    Atherton

FOREIGN PATENT DOCUMENTS

| DE | 25 29 475 A1 | 1/1977 |
|---|---|---|
| DE | 42 37 196 C1 | 2/1994 |
| DE | 198 33 210 A1 | 2/2000 |
| EP | 0 889 521 A2 | 1/1999 |

OTHER PUBLICATIONS

Chen, C. J. et al.: "An On–Chip, Interconnect Capacitance Characterization Method with Sub–Femto–Farad Resolution", IEEE, vol. 11, No. 2, May 1998.
Chen, J. C. et al.: "An On–Chip, Interconnect Capacitance Characterization Method with Sub–Femto–Resolution", IEEE, vol. 10, Mar. 1997.
McGaughy, B. W. et al.: "A Simple Method for On–Chip, Sub–Femto Farad Interconnect Capacitance Measurement", IEEE, vol. 18, No. 1, Jan. 1997, pp. 21–23.
Chen, J. C. et al.: "An On–Chip, Attofarad Interconnect Charge–Based Capacitance Measurement (CBCM) Technique", IEEE, 1996, pp. 3.4.1–3.4.4.

*Primary Examiner*—N. Le
*Assistant Examiner*—Timothy J. Dole
(74) *Attorney, Agent, or Firm*—Laurence A. Greenberg; Werner H. Stemer; Gregory L. Mayback (57) ABSTRACT

A circuit configuration for assessing capacitances in a matrix, which has a number of rows with at least one capacitance in at least one dimension, includes a test arm connected to first electrodes of each of the capacitances to be assessed and by which two different potentials can be applied to the first electrodes, a measurement arm connected to second electrodes of each of the capacitances to be assessed and that has a first measurement path and a second measurement path connected to a common potential. The first measurement path has an instrument for assessing the capacitances and the first and second measurement paths can be connected to the second electrodes. The circuit configuration has a drive device that connects each of the capacitances to be assessed individually to the two different potentials.

49 Claims, 5 Drawing Sheets

CIRCUIT CONFIGURATION AND METHOD FOR ASSESSING CAPACITANCES IN MATRICES

CROSS-REFERENCE TO RELATED APPLICATION

This application is a continuation of copending International Application No. PCT/DE01/00626, filed Feb. 16, 2001, which designated the United States and was not published in English.

BACKGROUND OF THE INVENTION

Field of the Invention

The present invention relates, in general, to a circuit configuration and to a method for assessing capacitances in matrices.

Assessing capacitances as exactly as possible, that is to say, numerical determination of a value of the capacitance in a unit that is provided, plays a major role in numerous technological applications, especially in the case of small capacitances. For certain measurement purposes, for example, where the magnitude of the capacitance must be known as exactly as possible, precise determination of the capacitance or capacitances in the circuit is important for achieving the desired result.

Especially for parametric description of CMOS processes and other technologies, it is necessary to characterize the absolute value of intentional on-chip capacitances, for example, for analog applications, and of parasitic capacitances which are unintentional but are technically unavoidable, for example, deposited conductors, conductor crossings in different metal planes, etc. Furthermore, for analog applications (which are also highly critical) it is necessary to know the matching response (pairing response) of desired on-chip capacitances, that is to say, capacitance ratios must be characterized.

To allow a large number of embodiment variants to be assessed while occupying only a small area on the chip surface, and/or to obtain—likewise while occupying a reasonable area on the chip surface—a good statistical basis for the investigations that are carried out, for example, for matching investigations, it is worthwhile to dispose the capacitances that need to be characterized in the form of matrices.

Furthermore, capacitance configurations in the form of matrices need to be used, for example, in capacitive sensors whose object is to measure parameters that can be recorded capacitively, within certain limits, as a function of the location (examples: position-resolving pressure sensors, fingertip sensor).

In this case, very high accuracy is desirable or required for these situations in certain applications. A number of measurement methods and circuits exist in the prior art that convert the capacitance to be characterized to a current, a voltage, or a frequency because these parameters can be measured with high accuracy and with relatively few problems by using external test equipment. Direct measurement of the capacitance value is impossible in any case due to the parasitic effects in external supply lines, as well as supply lines and pads on-chip.

Circuits for on-chip capacitance/voltage conversion, on-chip capacitance/current conversion, or on-chip capacitance/frequency conversion are, furthermore, required in products in which sensor signals that originate from capacitive sensors must be assessed and processed further (for example, capacitive pressure sensors, acceleration sensors, . . . ).

However, all the already existing circuits have the disadvantage that internal parasitic capacitances, as well as other non-ideal features of the components used, lead to certain measurement errors, which become greater the smaller the capacitance that is to be characterized.

Principles and circuits are specified in the prior art that convert the value of capacitances or the ratio of two or more capacitances to a variable that can be handled more easily, such as a current, voltage, or frequency, or current, voltage, or frequency ratios. However, all of these circuits have the disadvantages described in the following text:

Parasitic capacitances and other non-ideal characteristics of the actual components used in the respective assessment circuit corrupt the measurement result or must be compensated for as far as possible by circuitry. However, none of the compensation methods existing so far lead to complete suppression of errors.

Many of the stated concepts normalize the measured values to a likewise integrated reference capacitance, even though this is not quantitatively known exactly. These methods, thus, admittedly allow statements to be made about capacitance ratios, as are required for matching investigations, but precise circuits are, on one hand, too expensive, while the resolution that is achieved remains restricted despite all the configuration complexity, due to parasitic effects and non-ideal features of the components that are used. In any case, circuits such as these do not allow the absolute values of small capacitances (for example, conductor crossings) to be determined, as is necessary for process configurations.

An assessment circuit has, therefore, been proposed, for example, by Chen et al. in "Proceedings of the IEEE International Conference on Microelectronic Test Structures", 1997, page 77, and "IEEE Transactions on Semiconductor Manufacturing", Volume 11, No. 2, 1998, page 204. However, even with such a method, it was impossible to completely exclude from the measurement the parasitic capacitances that occur in actual components.

In summary, it can be stated that no method or circuit yet exists that allows the absolute values of capacitances, especially of on-chip capacitances in matrix configurations of capacitances, to be determined in a simple and precise manner, free of parasitic effects and free from the influence of non-ideal characteristics of the components used in the assessment circuit. This also applies to circuits for precise assessment of capacitance ratios. It is, of course, also true that the problem of characterization of capacitance ratios would be solved at the same time if a high-precision circuit or method for determining absolute values were available.

SUMMARY OF THE INVENTION

It is accordingly an object of the invention to provide a circuit configuration and method for assessing capacitances in matrices that overcome the hereinafore-mentioned disadvantages of the heretofore-known devices and methods of this general type and that make it possible for measurement purposes to eliminate parasitic effects and other discrepancies in the correct determination of capacitances in matrices.

With the foregoing and other objects in view, there is provided, in accordance with the invention, a circuit configuration for assessing capacitances, including the steps of a matrix in at least one dimension having rows each with at least one capacitance having first and second electrodes, a test arm connected to the first electrode of each of the at least one capacitance to be assessed, the test arm adapted to apply two different potentials to the first electrode, a measurement arm having first and second measurement paths each connected to a common potential, the first measurement path having an instrument for assessing the at least one capacitance, the measurement arm connected to the second electrode of each of the at least one capacitance to be assessed, the first and second measurement paths adapted to connect to the second electrode of each of the at least one capacitance, and a drive device connecting each of the at least one capacitance to the two different potentials for individually assessing each of the at least one capacitance.

The invention is directed, first of all, to a circuit configuration for assessing capacitances in a matrix having a number of rows with at least one capacitance in at least one dimension, a test arm connected to a first electrode of each of the capacitances to be assessed and by which two different potentials can be applied to the first electrodes, and a measurement arm connected to the second electrodes of each of the capacitances to be assessed and that has a first measurement path and a second measurement path that are connected to a common potential, wherein the first measurement path has an instrument for assessing capacitance, and the first and second measurement paths can be connected to the second electrodes; in which the circuit configuration is characterized by a drive device that can connect each of the capacitances to be assessed individually to the two different potentials.

In such a context, the capacitances to be assessed should be understood as meaning all the capacitances that there are in a matrix and that need to be measured, for example, on-chip capacitances, which can be produced using semiconductor processes, or capacitances in discrete circuit configurations, capacitors, etc.

A matrix has a configuration of capacitances. In the simplest case, such a matrix is a single row of capacitances, which can be referred to as a one-dimensional matrix because there is a configuration of capacitances in only one of the dimensions. A two-dimensional matrix has a number of rows of capacitances (in comparison to which the one-dimensional matrix has only one capacitance for each of these rows), with each of the capacitances in a row belonging to another row of capacitances in the other dimension. Correspondingly, each of the capacitances is defined by its unique association with the rows in the two dimensions. The situation is precisely the same in three-dimensional or multidimensional matrices, although such matrices have more groups of rows of capacitances. Each capacitance has two electrodes, which are connected to the rest of a circuit. In the case of the circuit configuration for assessing capacitances, that part of the circuit connected to the one electrode of each of the capacitances is referred to as a test arm because it is involved in the testing of the capacitances, and that arm connected to the other electrode of each of the capacitances is referred to as a measurement arm, so called because the actual measurement, that is to say, the assessment of the capacitances, is carried out in this arm. In such a context, a path should be regarded as an electrical conductor system that connects points uniquely and that, apart from the actual conductors, may include further elements such as switches, transistors, and measurement instruments.

Such a circuit according to the invention makes it possible to carry out the method according to the invention for assessment of capacitances by virtue of the capability to apply the various potentials.

The fundamental principle according to the invention is to activate in each case at least one of the capacitances to be assessed, that is to say, to apply the potentials used to them, to allow the capacitance assessment to be carried out, and, then, to use the measurement arm to assess the capacitance without any measurement errors. If suitably driven, capacitances may be also be grouped so that a number of capacitances can be assessed at the same time. It is also possible for a corresponding matrix of capacitances to be allocated a number of assessment circuits, which are either each responsible for subregions of the matrix, or which can all be connected to any desired capacitances in the matrix.

In accordance with another feature of the invention, the drive device(s) preferably has/have a configuration of switching paths for each dimension of the matrix, with each of the rows of capacitances being associated with at least one switching path having a drive and at least one control switching element, which can be switched by the drive and is integrated in the test arm, and which allows at least one of the two different potentials to be applied to the first electrodes of a row of capacitances.

Such a configuration results in the formation of an n-dimensional grid of switching paths, by which a specific capacitance, located at the intersection of the rows, can be driven by selection of in each case one of the rows per dimension. The activation process takes place in a simple manner by connecting the first and the second potential to the electrode of the capacitance, with the connection effected using the switching elements that, for each of the dimensions, are installed in the test path at a point in that part of the test path responsible for the respective capacitance.

In such a case, it is possible for the switching paths of at least one dimension for each of the capacitances in a row to have at least one control switching element integrated in that part of the test arm that leads to the capacitance. Each part of the test arm that supplies a capacitance, thus, has its own control switching element to activate it for such dimensions. The control switching elements that are driven by one switching path, in a row of capacitances, are switched at the same time.

Alternatively, the switching paths of at least one dimension for each of the rows of capacitances may have at least one control switching element integrated in that part of the test arm that leads to the row. Thus, in such a variant, it is not possible to switch each capacitance in the respective dimension individually, and only entire rows can be switched. In comparison to the above described option, this configuration represents a simplification because only one control switching element is now required for each of the switching paths. It is self-evident that the two concepts for connection can be combined with one another so that, for example, each individual capacitance has its own switching element for a first dimension, and all the capacitances are activated through a common control switching element for a second dimension.

In accordance with a further feature of the invention, to provide the control for the switching paths, the drive device may have an address decoder with an individually drivable output for each of the rows of capacitances, and the drives may have a signal line between each output and the control switching element. A dedicated address decoder is required for each of the dimensions, and the address decoders for the individual dimensions may be combined to form a common unit.

In accordance with an added feature of the invention, an AC voltage can simply be applied to the test arm, whose amplitude maxima, then, in each case represent the two different potentials. The AC voltage may, preferably, be a square-wave voltage to enable switching backward and forward clearly and quickly between the two different potentials.

Alternatively, it is also possible for the test arm for each of the capacitances to have a first test path with a first switching element and a second test path with a second switching element, in which case a first potential is applied to the first test path and a second potential is applied to the second test path, and both test paths are connected through a node to the first electrode. Such a preferred configuration by the two switching elements ensures that the different potentials can be applied to the electrode of one capacitance. In such a case, they can be connected through switching elements that are integrated in the test paths.

Advantageously, it should be possible to switch on both test paths in each case. It is, thus, preferable for the switching paths of at least one dimension for each of the capacitances in a row to have a control switching element that is integrated in the first test path, and to have a control switching element that is integrated in the second test path.

Such a circuit configuration can also be simplified as above by the switching paths of at least one dimension for each row of capacitances having a control switching element integrated in the first test path and a control switching element integrated in the second test path. Thus, in such an embodiment, all the capacitances in one row, which are controlled by a common switching path, are, once again, switched by a single control switching element (provided the corresponding control switching elements are also switched on in the other dimensions).

What has been stated above with regard to the switching elements also applies in the measurement arm, which may be characterized in that the first measurement path is connected through a third switching element, and the second measurement path is connected through a fourth switching element. At least one of the switching elements is, preferably, a transistor. In fact, in normal circuits, especially in the case of semiconductor circuits, all the switching elements are transistors.

In accordance with an additional feature of the invention, the instrument for assessment of the capacitances is, preferably, an ammeter. However, it is also feasible to use other instruments, provided they are suitable for carrying out an assessment of the capacitances that are to be assessed. In particular, so-called integrating instruments are used, which are able to determine a current flow integral on the measurement path. As will be explained further below in detail, the measurement instrument assesses the capacitance during the charging or during the discharging of the capacitance with the potentials. During the complementary process, that is to say, the discharging or the charging, the measurement instrument, in contrast, does not carry out any assessment.

However, it is possible to integrate a second measurement instrument in the second measurement path, which carries out a second assessment, which is independent of the first assessment, of the capacitance during the complementary process to the first assessment, that is to say, during discharging or charging. The accuracy of the method according to the invention can be further improved by matching the two assessments that are so obtained and are independent of one another.

One important aspect of the method according to the invention is that the application of the various potentials to the various paths, or arms, of a circuit configuration is coordinated in time. It is, thus, preferable for driving the switching elements to provide clock signals that are passed directly or indirectly to the switching elements and that make it possible to apply the various relevant potentials cyclically and in a synchronized manner to the electrodes of the capacitance that is to be assessed. These various clock signals may be generated independently of one another, or may have a common source. For example, it is possible to apply a common clock AC voltage as a clock signal to the first switching element and to the second switching element, and for the first or second switching elements to be configured such that they are or can be switched alternately by the AC voltage. For example, when using transistors, it is possible, for such a purpose, for the first and second switching elements to have a pMOS transistor and an nMOS transistor, which are or can be switched alternately by the clock AC voltage.

To ensure the synchronization of the clock signals of any clock AC voltage that may be used, in a simple manner, it may also be preferable for the circuit configuration also to have a clock signal producing device for producing the clock signals applied to the switching elements, and for producing any clock AC voltage that may be used, from a master clock signal.

Only one master clock signal is, therefore, required o generate, from the master clock signal, all the other clock signals that are required to carry out the method according to the invention with the circuit configuration.

To further simplify the embodiment of the circuit configuration, it may also be preferable for the common potential to be equal to the first or the second potential. Once again, it may be advantageous for the first or second potential to be an operating voltage, which is present in any case in the circuit configuration, and for the other of the second or first potential to be ground.

With the objects of the invention in view, there is also provided a circuit configuration for assessing capacitances, including a matrix in at least one dimension having rows each with at least one capacitance having first and second electrodes, a test arm connected to the first electrode of each of the at least one capacitance to be assessed, the test arm adapted to apply two different potentials to the first electrode, a measurement arm having first and second measurement paths each connected to a common potential, the first measurement path having an instrument for assessing the at least one capacitance, the measurement arm connected to the second electrode of each of the at least one capacitance to be assessed, the first and second measurement paths adapted to connect to the second electrode of each of the at least one capacitance, and a means for connecting each of the at least one capacitance to the two different potentials and for individually assessing each of the at least one capacitance.

With the objects of the invention in view, there is also provided a method for assessing capacitances, including the steps of providing a matrix in at least one dimension having rows each with at least one capacitance having first and second electrodes, connecting a test arm to first electrodes of each of the capacitances to be assessed, the test arm adapted to apply first and second different potentials to the first electrodes, providing a measurement arm having first and second measurement paths each connected to a common potential, the first measurement path having an instrument for assessing the capacitances, connecting the measurement arm to second electrodes of each of the capacitances to be assessed, the first and second measurement paths adapted to connect to the second electrodes, enabling individual assessment of each capacitance by connecting each capacitance to the first and second potentials through a drive device, respectively charging and discharging the capacitances to be assessed by alternately applying the first potential and the second potential to the first electrode of the capacitance through the test arm and applying the common potential to the second electrode of the capacitance through the measurement arm, and performing at least one assessment of the capacitance during one of the charging and the discharging of the capacitance in the measurement arm by connecting the second electrode of the capacitance to the common potential through the instrument for at least one assessment during one of the charging and the discharging of the capacitance in a first measuring path of the measuring arm with the common potential, and connecting the second electrode of the capacitance to the common potential through the second measurement path of the measurement arm during one of the discharging and the charging of the capacitance when the at least one assessment is not carried out.

The invention is further directed at a method for assessing capacitances, in particular, using the circuit configuration according to the invention as described above, having the following steps:

activation of at least one specific capacitance, which is to be assessed, in a matrix that has a number of rows with at least one capacitance in at least one dimension;

charging and discharging of the activated capacitance to be assessed, by alternate application of a first potential, and of a second potential, which is not the same as the first, to a first electrode of the capacitance through a test arm, and application of a common potential to a second electrode of the capacitance through a measurement arm; and at least one assessment of the capacitance during the charging or discharging of the capacitance in the measurement arm.

With regard to the advantages and details of the method according to the invention, reference is made to the entire contents of the above statements relating to the circuit configuration. It is, likewise, self-evident that all that has been stated for the method according to the invention should apply in the same way to the circuit configuration according to the invention. The principle of the method according to the invention is based on the fact that, after activation of a specific capacitance in a matrix of capacitances, one of the two electrodes of the capacitance to be assessed (when using a switching configuration according to the invention, the electrode that is connected to the test arm) has its charge level reversed cyclically between two potentials, while the other electrode remains at a common potential, and the capacitance is assessed only based upon the charging or discharging process.

In accordance with yet another mode of the invention, the activation is, preferably, carried out by switching on that part of the test arm leading to a specific capacitance.

In accordance with yet a further mode of the invention, the specific part of the test arm can be switched on by control switching elements integrated in such a part of the test arm, with one control switching element being provided for each of the dimensions.

Alternatively, the specific part of the test arm can be switched on by control switching elements that are integrated in the test arm, with one control switching element being integrated in this specific part of the test arm for at least one of the dimensions, and one control switching element being integrated in a part of the test arm for at least one of the dimensions, leading to a row of capacitances and also being associated with the specific part. These two embodiments can be combined with one another if there are a number of dimensions.

In accordance with yet an added mode of the invention, the at least one assessment of the capacitance is, preferably, carried out by an instrument integrated in a first measurement path of the measurement arm. Such a measurement instrument may, for example, be an ammeter so that the assessment can be carried out by measurement of a current flow integral through the first measurement path of the measurement arm during the charging or discharging of the capacitance.

To minimize the error during the measurement assessment of the capacitance, it is particularly preferable, if the capacitance is assessed during charging, that the at least one assessment is not carried out during discharging, and that, if the capacitance is assessed during discharging, the at least one assessment is not carried out during charging.

In accordance with yet an additional mode of the invention, the common potential that is applied according to the invention and must be passed through the measurement instrument during the assessment is, preferably, applied directly to the second electrode through a second measurement path of the measurement arm, during which the at least one assessment is not carried out. Such a process makes it possible to reliably ensure that a measurement is carried out through the measurement instrument only during the actual measurement process, that is to say, either during charging or during discharging, and that the second electrode, nevertheless, remains at the common potential throughout the entire period to ensure charge reversal. The measurement time profiles described above during charging and discharging do not mean that a measurement must be carried out or that a specific potential must be applied to the electrodes at all times. In fact, it is also possible to apply potentials, and to carry out measurements, only during specific time intervals, while, in other time intervals, the configuration that is used for the method according to the invention is completely decoupled from all external potentials so that no measurement is carried out either.

However, it is preferable for the assessment of the capacitance to be carried out such that the entire charging process or the entire discharging process is recorded.

As already stated above with respect to the apparatus, a further, independent assessment may be carried out during the complementary process for the at least one assessment. The invention, thus, preferably has the further step of a second assessment of the capacitance during the process of discharging or charging, during which the at least one assessment is not carried out.

In accordance with again another mode of the invention, the second assessment of the capacitance is, preferably, carried out by a second instrument, which is integrated in a second measurement path, to ensure that the current flow that is derived from the first instrument can flow through the second instrument during the complementary process of discharging or charging.

In accordance with again a further mode of the invention, the alternating application of the first and second potentials to the first electrode may be carried out, for example, in a simple case by application of an AC voltage to the test arm. However, it is also possible for the alternating application of the first and second potentials to be carried out by alternate connection of a first test path at a first potential, and of a second test path at a second potential, to the first electrode.

Such a connection process may be carried out, for example, by switching elements, for example, switches or transistors, which are integrated in the test paths.

In accordance with again an added mode of the invention, to ensure that an assessment of the capacitance is actually carried out only during the desired process, that is to say, for example, during charging or discharging, it is possible for the first measurement path and the second measurement path to be connected to the second electrode alternately. Such a connection process may also be carried out by switching elements that are integrated in the measurement paths.

In accordance with a concomitant mode of the invention, a particularly preferred embodiment of the method according to the invention leads to a further reduction in the measurement error because the mismatch within the measurement arm is eliminated. Such a method includes the further steps of:

interchanging of the time correlation between the application of the first and second potentials and the at least one assessment during charging or discharging;

renewed assessment of the capacitance in the measurement arm; and more accurate determination of the capacitance from the two assessments.

The interchanging of the time correlation can be carried out, for example, by shifting the phase of the AC voltage through 180° with respect to the time period of the at least one assessment, or by interchanging either the time drive to the two measurement paths or the application of the two potentials to the test arm with one another.

Other features that are considered as characteristic for the invention are set forth in the appended claims.

Although the invention is illustrated and described herein as embodied in a circuit configuration and method for assessing capacitances in matrices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Before the invention is explained in detail, the circuit configuration that is used for the invention for assessment of an individual capacitance will be described.

Figure 1A:
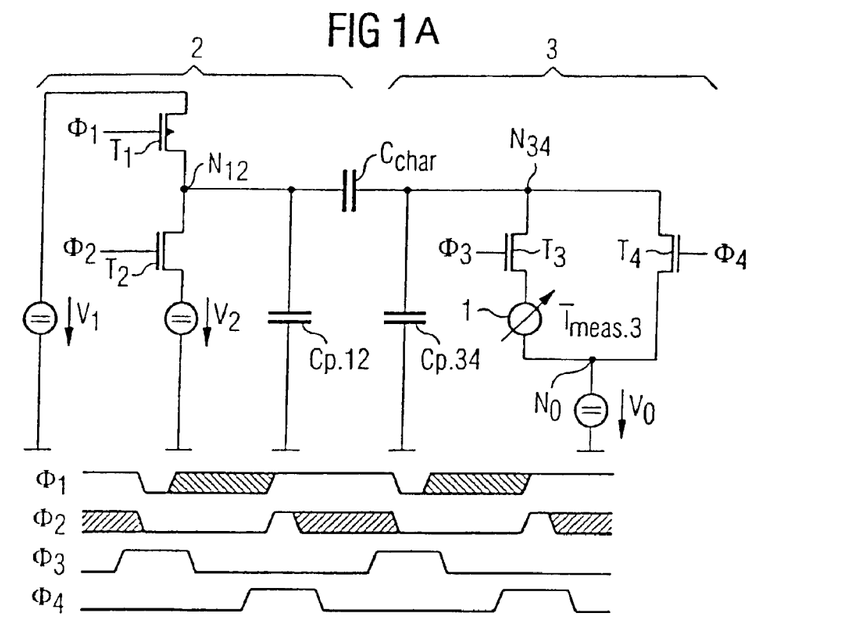
FIG. 1A is a schematic circuit diagram of a circuit configuration for carrying out actual assessment of each individual capacitance according to the invention and a corresponding signal flow diagram.
Figure 1B:
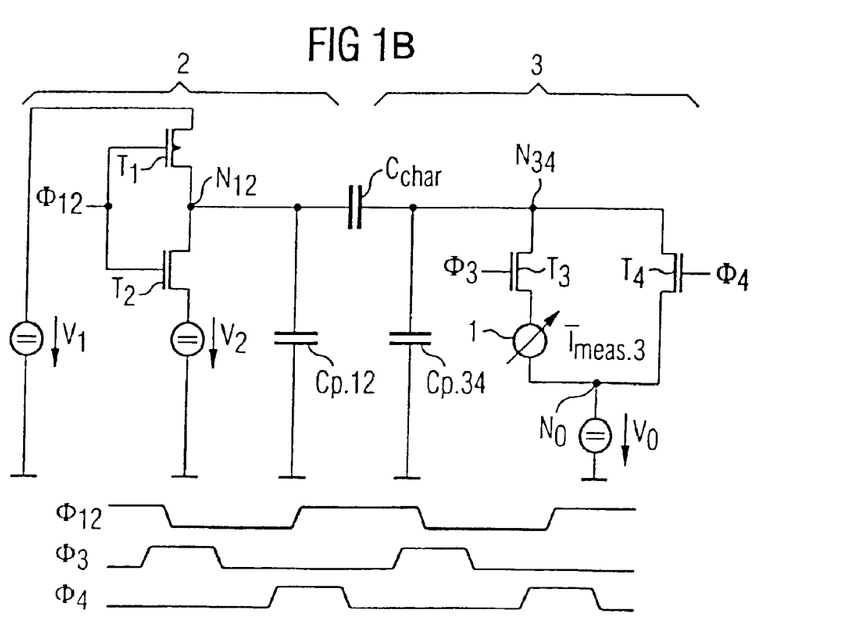
FIG. 1B is a schematic circuit diagram of a circuit configuration for carrying out actual assessment of each individual capacitance according to the invention and a corresponding signal flow diagram.

Referring now to the figures of the drawings in detail and first, particularly to FIGS. 1A and 1B thereof, there is shown a schematic illustration of an outline circuit that can be used in the invention. The capacitances $C_{p,12}$ and $C_{p,34}$ that are also shown in the figures represent the parasitic capacitances, which are unavoidable in actual technical applications, at the nodes $N_{12}$ and $N_{34}$. Their effect on the operation of the circuit, and the fact that these parasitic capacitances do not corrupt the measurement result, will be discussed in detail further below.

The principle illustrated in FIGS. 1A and 1B is based on a first electrode of the capacitance $C_{char}$, which is connected to the node $N_{12}$ of the test arm 2, having its charge reversed cyclically between the voltage values $V_1$ and $V_2$ that are applied to the two test paths, while the other, second electrode, which is connected to the node $N_{34}$ of the measurement arm 3, remains at the common potential $V_0$ and the mean value of the displacement current that occurs only during the charging process (or, depending on the definition and choice of $V_1$, $V_2$, and $V_{34}$, possibly also the discharging process), which occurs between the electrode of the capacitance that is at the constant potential $V_0$, is measured and the voltage source that supplies such a potential. This is done:

in that one of the two electrodes of the capacitance (that which is connected to the node $N_{12}$ of the test arm in the figures) is connected by the switching elements (in this case the transistors T1 and T2) in a cyclically alternating manner in accordance with the timing diagram shown in the figures to the potentials $V_1$ and $V_2$ so that the node $N_{12}$ has its charge reversed between these two potentials with the same period;

in that the other of the two electrodes (that which is connected to the node $N_{34}$ of the measurement arm in the figures) is connected to a fixed potential, for example, $V_0$, with the connection of this electrode to the voltage source that supplies the potential $V_0$ being produced in accordance with the timing diagram shown in FIG. 1A, either through the current test path that is produced by closing the transistor T3 or else through the current test path that is produced by closing the transistor T4; and in that either the displacement current ($\bar{I}_{meas,3}$ in FIG. 1A) that occurs during the charging or discharging process is measured by a suitable instrument that responds slowly to the chosen clock frequency and, hence, has an integrating effect, and in which case the current measurement instrument 1 is located either (as shown in the figure) in the same current measurement path as the transistor T3 or in the same current measurement path as the transistor T4. In this case, other forms of switching elements may also be used instead of the illustrated transistors at all these points.

As can be seen from the timing diagram in FIG. 1A, all the signals $\Phi_1$, $\Phi_2$, $\Phi_3$, and $\Phi_4$ that are used for drive purposes are at the same frequency, but have different phase angles and possibly also different duty cycles.

Based on the timing diagram that is shown in FIG. 1A for the "OPEN" and "CLOSED" states of the transistors $T_1$, $T_2$, $T_3$, and $T_4$ that are defined by the drive signals $\Phi_1$, $\Phi_2$, $\Phi_3$, and $\Phi_4$ satisfaction of the two following conditions, which are advantageous for the operation of the method, is guaranteed:

the node $N_{34}$ is connected respectively through one and only one of the two possible measurement paths to the potential $V_0$ before the start and after the end of a charge-reversal process on the capacitance to be assessed so that the current measurement instrument 1—depending on whether it is located in the same measurement path as the transistor $T_3$ or else in the same measurement path as the transistor $T_4$—measures either the displacement current that corresponds to the entire charging process or else the displacement current that corresponds to the entire discharging process of the capacitance $C_{char}$.

the frequency and duration of the "OPEN" phases of the signals $\Phi_1$, $\Phi_2$, $\Phi_3$, and $\Phi_4$ are chosen such that the potential at the node $N_{12}$ in each case reliably reaches the full values $V_1$ and $V_2$ during the charge-reversal processes.

The timing diagram in FIG. 1A furthermore shows time intervals (hatched areas) in which one or the other or else both of the two electrodes of the capacitance $C_{char}$ floats or float. In particular, the transistors $T_1$ and $T_2$ can be driven in an exactly complementary manner, that is to say $T_1$ ($T_2$) is in each case closed at the same time that $T_2$ ($T_1$) is opened, and the drive signal $\Phi_2$ is exactly complementary to the drive signal $\Phi_1$.

The capacitance is calculated from the parameters $V_1$, $V_2$, and $f=1/T$ by equation (1) set forth herein. The choice of the potential $V_0$ has no influence on the measurement result, provided that $C_{char}$ is independent of voltage, that is to say, it is an ideal capacitance.

Furthermore, the measurement result is not influenced by the value or the other characteristics, for example, linearity or voltage dependence, of the parasitic capacitances $C_{p,12}$ and $C_{p,34}$. Although the parasitic capacitance $C_{p,12}$ likewise has its charge reversed between the potentials $V_1$ and $V_2$, the current that is required to do the reversal flows exclusively through the transistors $T_1$ and $T_2$ and through the sources $V_1$ and $V_2$, however, but not through the transistors $T_3$ and $T_4$ and, hence, not through the current measurement instrument 1 and the source $V_0$ either. Because the displacement current that flows between the node $N_{34}$ and the voltage source $V_0$ is used as the measurement variable $\bar{I}_{meas,3}$ in this case, and, this is exactly equal to the current that is required to reverse the charge on that electrode $C_{char}$ that is connected to the node $N_{12}$ ($\neq$ total current for charge reversal at the node $N_{12}$), this measurement variable is not adversely affected by the parasitic capacitance $C_{p,12}$.

The parasitic capacitance $C_{p,34}$ likewise does not influence the measurement result as its charge is not reversed because the potential at the node $N_{34}$ is constant during the entire measurement process, and, thus, does not lead to the occurrence of a charging/discharging current that can be associated with this capacitance, either.

It is possible to interchange and to invert the clocks $\Phi_1$ and $\Phi_2$ or $\Phi_{12}$ (provided the connection is made through n-MOS and p-MOS transistors $T_1$ and $T_2$, respectively) or to interchange the clocks $\Phi_3$ and $\Phi_4$ with one another, or to measure the current in the path that is connected to the transistor $T_4$ instead of the current in the path to the transistor $T_3$. With ideal components and measurement instruments, all these measures affect only the mathematical sign of the mean value of the measurement variable $\bar{I}_{meas}$, but not its magnitude.

The mean value with respect to time of the measured current for this ideal configuration is given by:

$$\bar{I}_{meas,1} = C_{char} \times (V_1 - V_2) \times f \quad (1)$$

where $f=1/T$ and $T$ is the period duration. For the capacitance to be assessed, this results in:

$$C_{char} = \frac{\bar{I}_{meas,1}}{f \times (V_1 - V_2)}, \text{ where } f = 1/T = \text{clock frequency}; \quad (2a)$$

$$\left(\left(\frac{1}{mT}\int_r^{r+mT} \bar{I}_{meas,1}(t)dt\right) \bigg/ (fx(V_1 - V_2))\right), \tau \text{ undefined}, m = 1, 2, 3; \quad (2b)$$

$$\left(\left(\frac{1}{m}\int_r^{r+mT} \bar{I}_{meas,1}(t)dt\right) \bigg/ (V_1 - V_2)\right), \tau \text{ undefined}, m = 1, 2, 3; \quad (2c)$$

$\bar{I}_{meas,1}$ in this case representing the mean value with respect to time of the measured current $I_{meas,1}$ (t) over an entire period T, or an integer multiple of this period, with the start point $\tau$ of this period or these periods being undefined. In metrology practice, the value of $C_{char}$ is obtained by measuring the mean value of the charging current $I_{meas,1}$ at a frequency f (for example, $f \geq 10$ kHz) that is not excessively low by a measurement instrument that is too inert at the chosen frequency to follow the waveform of the current, for example, all types of parameter analyzers offered by the company Hewlett-Packard, over a time period that is long in comparison to the period duration T. The measurement instrument, thus, has an integrating effect in this case.

Furthermore, parameter variations of the transistors $T_1$ and $T_2$ are irrelevant. A mismatch between the transistors $T_3$ and $T_4$ may, however, lead to a minor corruption of the measurement result, but such a mismatch can be completely compensated for by repeated measurement of the arm current with an inverted signal $\Phi_{12}$ (see FIG. 1B). In such a case, the capacitance is calculated from:

$$C_{char} = (|I_{meas,3}(\Phi_{12} \text{ not inverted})| + |I_{meas,3}(\Phi_{12} \text{ inverted})|)/[2 \times (V_1 - V_2) \times f] \quad 2(a)$$

or $$C_{char} = (|I_{meas,4}(\Phi_{12} \text{ not inverted})| + |I_{meas,4}(\Phi_{12} \text{ inverted})|)/[2 \times (V_1 - V_2) \times f]. \quad 2(a)$$

A mismatch in the levels of the signals $\Phi_3$ and $\Phi_4$ may, likewise, have a similar effect to a threshold voltage mismatch of the transistors $T_3$ and $T_4$. This effect is also compensated for by the measure mentioned above, or can be completely suppressed by the signals that are provided for driving the gates of $T_3$ and $T_4$ being buffered on-chip by inverters, which are, in turn, operated using identical supply voltages.

According to the timing diagram in FIG. 1A, it is possible to choose $\Phi_1 = \Phi_2$. Such a practically highly relevant special case is illustrated in FIG. 1B where the signals $\Phi_1$ and $\Phi_2$ from FIG. 1A are combined to form a signal $\Phi_{12}$ that drives the common gate connection of the transistors $T_1$ and $T_2$. The transistors $T_1$ and $T_2$ in such a case form a simple CMOS inverter, which is required for driving only one input signal, thus, representing an advantageous simplification in comparison to the circuit shown in FIG. 1A.

The frequency and duration of the corresponding time intervals of the clock signals $\Phi_1$, $\Phi_2$, $\Phi_3$, and $\Phi_4$, or $\Phi_{12}$, $\Phi_3$, and $\Phi_4$ in this specific implementation with actual components must be chosen such that the capacitance $C_{char}$ can be charged to the full value of $V_1$ and can be discharged to the full value of $V_2$, and such that the respective displacement currents decay completely once again during the time intervals in which $T_3$ or $T_4$ is switched on.

Figure 2A:
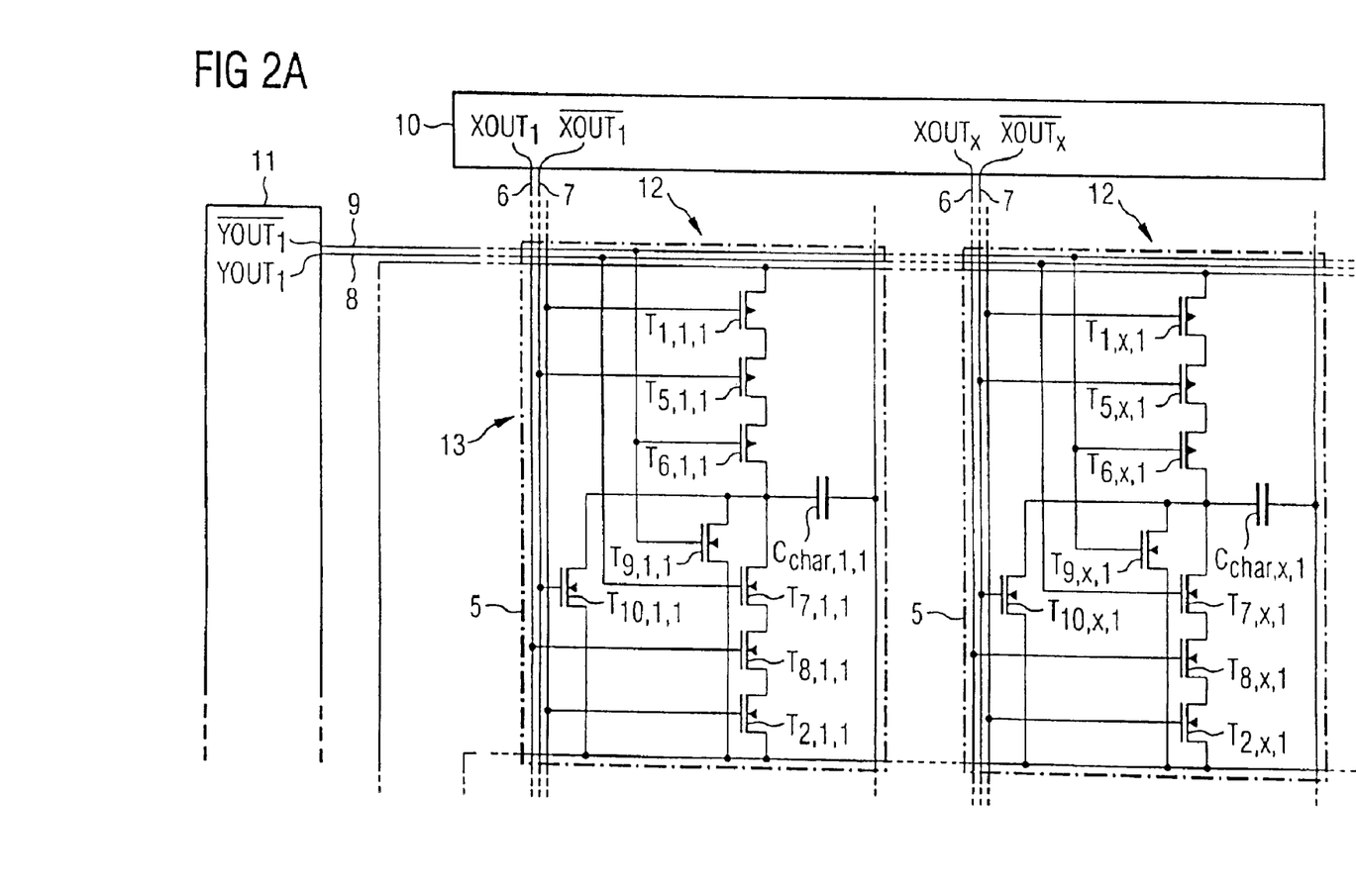
FIG. 2A is a fragmentary, schematic and block circuit diagram of a circuit configuration according to the invention and a corresponding signal flow diagram.
Figure 2B:
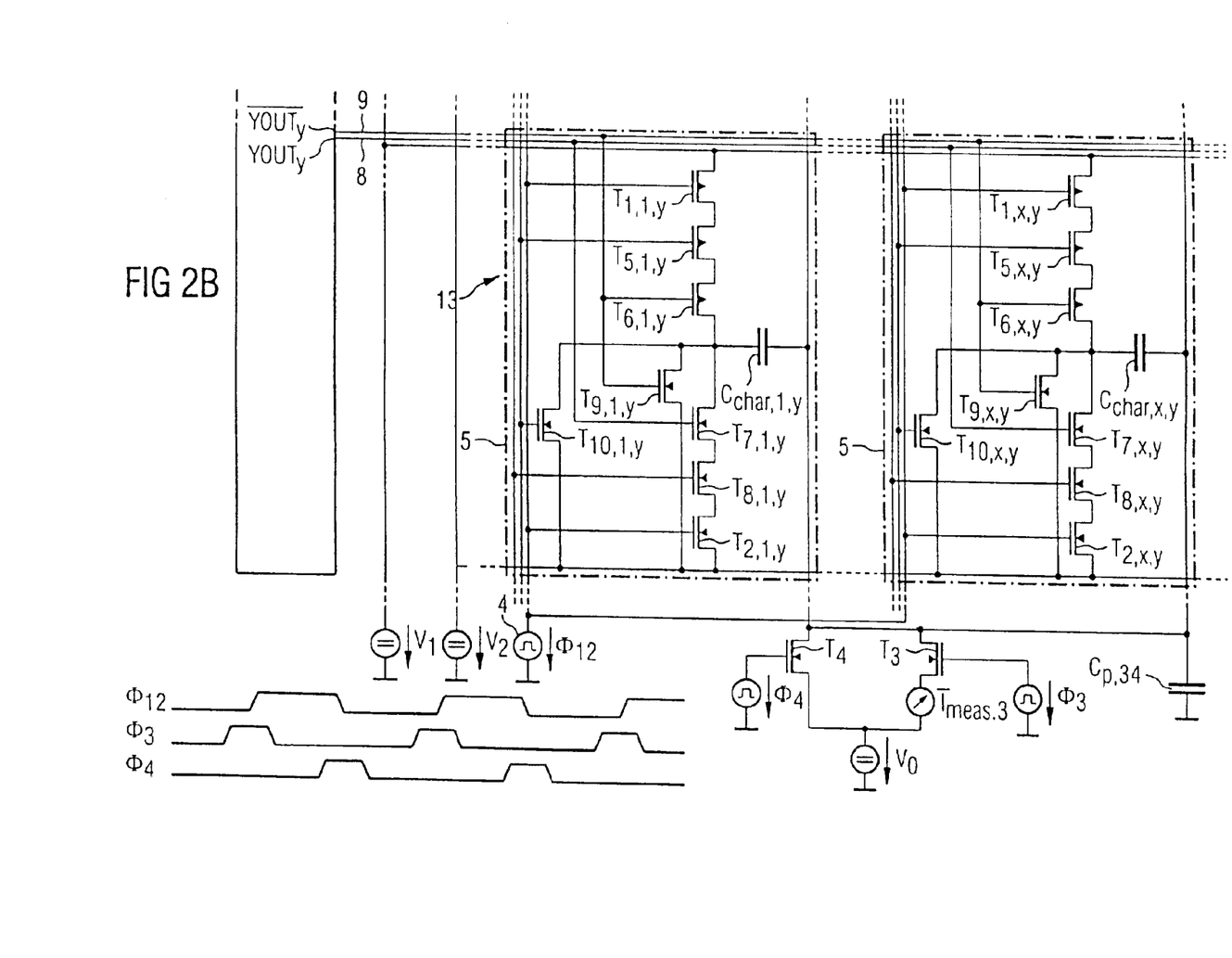
FIG. 2B is a fragmentary, schematic and block circuit diagram of a circuit configuration according to the invention and a corresponding signal flow diagram.

FIGS. 2A and 2B show an embodiment of the circuit configuration according to the invention with an N×M matrix circuit based on a CMOS process, in which the principle according to the invention as shown in FIGS. 1A and 1B has been applied to a matrix configuration. In such a case, there are rows of capacitances in one dimension (12) and in the other dimension (13). In addition to the capacitance $C_{char,x,y}$, x =1, 2, 3, . . . , y=1, 2, 3, . . . to be assessed, each "cell" 5 within the matrix contains transistors $T_{1,x,y}$ and $T_{2,x,y}$, whose function corresponds to the function of the transistors $T_1$ and $T_2$ in FIG. 1, as well as transistors $T_{5,x,y}$, $T_{6,x,y}$, $T_{7,x,y}$, and $T_{8,x,y}$ as control switching elements, by which one and only one capacitance or cell is selected within the matrix. The transistors $T_{5,x,y}$, $T_{6,x,y}$, $T_{7,x,y}$, and $T_{8,x,y}$ are in this case addressed through switching paths 6, 7, 8, 9. The function of the transistors $T_{9,x,y}$ and $T_{10,x,y}$ will be discussed further below.

The selection is made in that two drives, the x and y decoders 10, 11 supply a logic H signal (H) to the switching paths 6, 8 at one and only one of their outputs $XOUT_x$, x=1 . . . N or $YOUT_y$, y=1 . . . M, and supply a logic L signal (L) to the switching paths 6, 8 at all the other outputs. The corresponding logic complementary signals are produced at the complementary outputs $\overline{XOUT}_x$ and $\overline{YOUT}_y$ for the switching paths 7, 9.

Consequently, the transistors $T_{5,x,y}$, $T_{6,x,y}$, $T_{7,x,y}$, and $T_{8,x,y}$ are switched on only in the cell 5 with the coordinates x and y, where $1 \leq x \leq N$ and $1 \leq y \leq M$, for which $XOUT_x$ and $YOUT_y$=H, so that the charge on the capacitance that is located in this cell can be reversed through the transistors $T_{1,x,y}$ and $T_{2,x,y}$ that are driven through the signal $\Phi_{12}$. The transistors $T_{9,x,y}$ and $T_{10,x,y}$ in the cell are, furthermore, both switched off so that they do not influence the charge-reversal process. In all the others (those "cells" that have not been selected), at least one of the transistors $T_{5,x,y}$ and $T_{6,x,y}$ and at least one of the transistors $T_{7,x,y}$ and $T_{8,x,y}$ are switched off so that it is impossible for the charge on these capacitances within these cells to be reversed through the respective transistors $T_{1,x,y}$ and $T_{2,x,y}$. Furthermore, at least one of the transistors $T_{9,x,y}$ and $T_{10,x,y}$ within these cells is switched on there so that a defined potential (in this case, $V_2$-$V_0$) is produced across all the capacitances that have not been selected.

Table 1 shows the result of a simulation of a 2×2 matrix, which contains capacitances whose values are scattered about the mean value 10 fF. In such a case, furthermore, $V_1$=VDD=3.3 V, $V_2$=$V_0$=GND potential=0 V, and T is chosen to be 1000 ns.

The technological parameters for the transistors $T_1$-$T_4$ originate from a 3.3 V CMOS process with an oxide thickness of 9 nm and a minimum channel length of 0.5 μm. The channel length of all the transistors was chosen to be L=1 μm. The width of the transistors $T_3$ and $T_4$ in this case is W=10 μm, while all the other n-MOS transistors have a width W=1 μm, and all the p-MOS transistors have a width W=2 μm.

TABLE 1

Simulation for a 2 × 2 matrix as shown in FIGS. 2A and 2B.
$V_1$ = VDD = 3.3 V, $V_2$ = $V_0$ = GND potential = 0 V, and T = 1000 ns.

| Simulation | x position | y position | $C_{char,x,y}$ actual value (fF) | $C_{char,x,y}$ determined from simulation (fF) | Absolute error (fF) | Relative error (%) |
|---|---|---|---|---|---|---|
| 3.1 | 1 | 1 | 9 | 8.9985 | 0.0015 | 0.0167 |
| 3.2 | 1 | 2 | 9.9 | 9.8985 | 0.0015 | 0.0152 |
| 3.3 | 2 | 1 | 10.1 | 10.0983 | 0.0017 | 0.0168 |
| 3.4 | 2 | 2 | 11 | 10.9980 | 0.0020 | 0.0182 |

As can be seen, this results in an excellent match between the values specified in the simulation for $C_{char,x,y}$ and the determined value. The magnitude of the absolute assessment error is less than 0.002 fF, and the magnitude of the relative measurement error is, thus, $\leq 0.02\%$. With the operating voltage of VDD=3.3 V as used in the simulation, this corresponds to an error of about 40 elementary charges q (q=1.602 $10^{-19}$ As). It can, thus, be assumed that these discrepancies are due to numerical inaccuracies in the simulator, and are not due to characteristics of the circuit.

The comments in the following text are intended to supplement the explanation of this embodiment.

If it is permissible for one electrode of those capacitances that have not been selected to float, then there is no need for the transistors $T_{9,x,y}$ and $T_{10,x,y}$.

The sequence of the transistors $T_{1,x,y}$, $T_{5,x,y}$, and $T_{6,x,y}$ or $T_{2,x,y}$, $T_{7,x,y}$, and $T_{8,x,y}$ can be interchanged. It is also possible for the selection transistors not to be in individual discrete form within each cell with respect to one coordinate, that is to say, either $T_{5,x,y}$ and $T_{8,x,y}$ or $T_{6,x,y}$ and $T_{7,x,y}$, but for all the columns (first dimension) or else for all the rows (second dimension).

Figure 3:
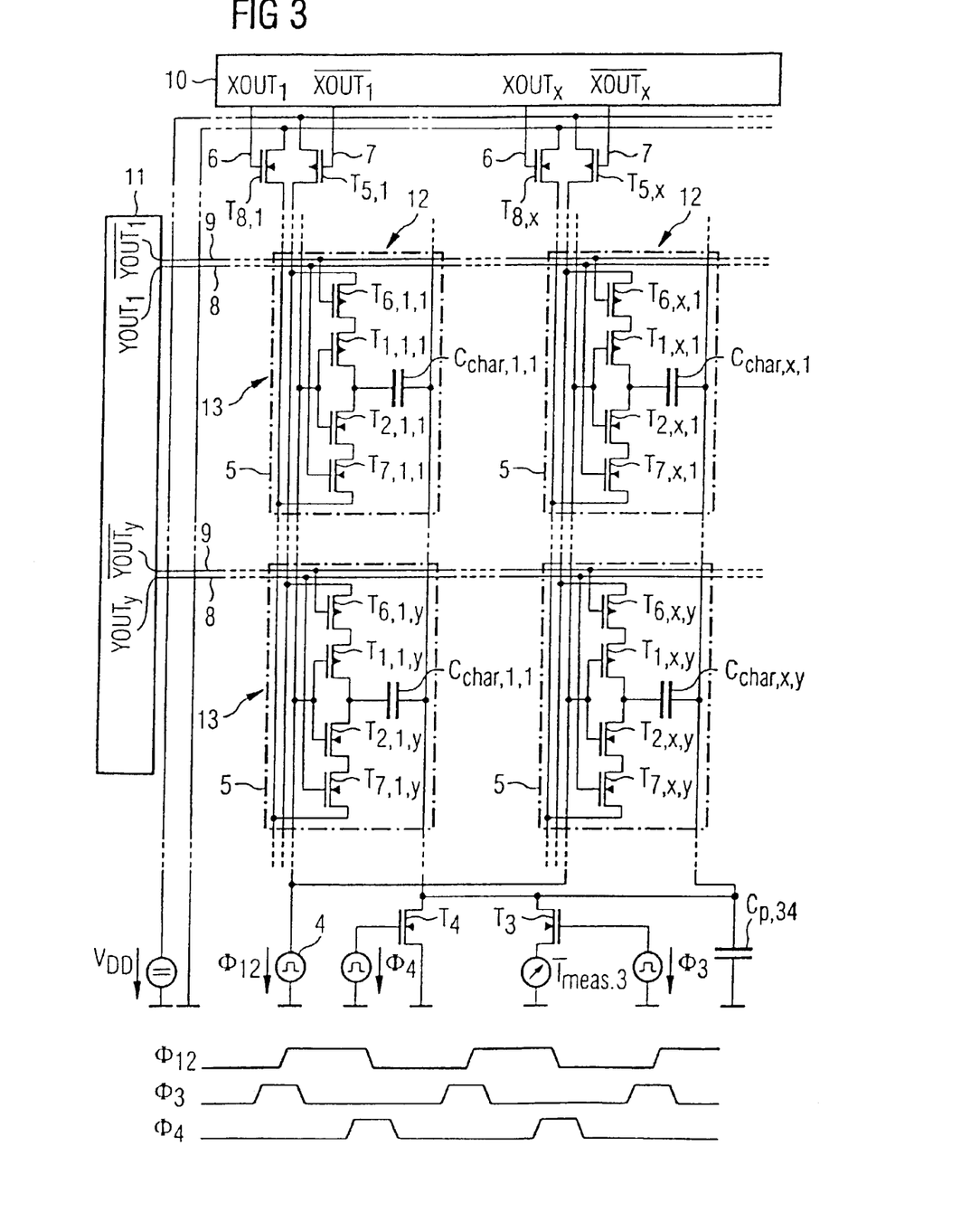
FIG. 3 is a fragmentary, schematic and block circuit diagram of an alternative embodiment of the circuit configuration according to the invention and a corresponding signal flow diagram.

FIG. 3 shows a further embodiment of the present invention, in which, based on the comments that have been made above, a possible interchanging of the sequence of the transistors within a cell has been carried out, with the transistors for the x selection $T_{5,x,y}$ and $T_{8,x,y}$ from FIG. 2 having been replaced by transistors $T_{5,x}$ and $T_{8,x}$, which now select complete rows 12 in one dimension, and in which the transistors $T_{9,x,y}$ and $T_{10,x,y}$ have been omitted. Furthermore, $V_1$=VDD=3.3 V, and $V_2$=$V_0$=GND potential=0 V.

Figure 4:
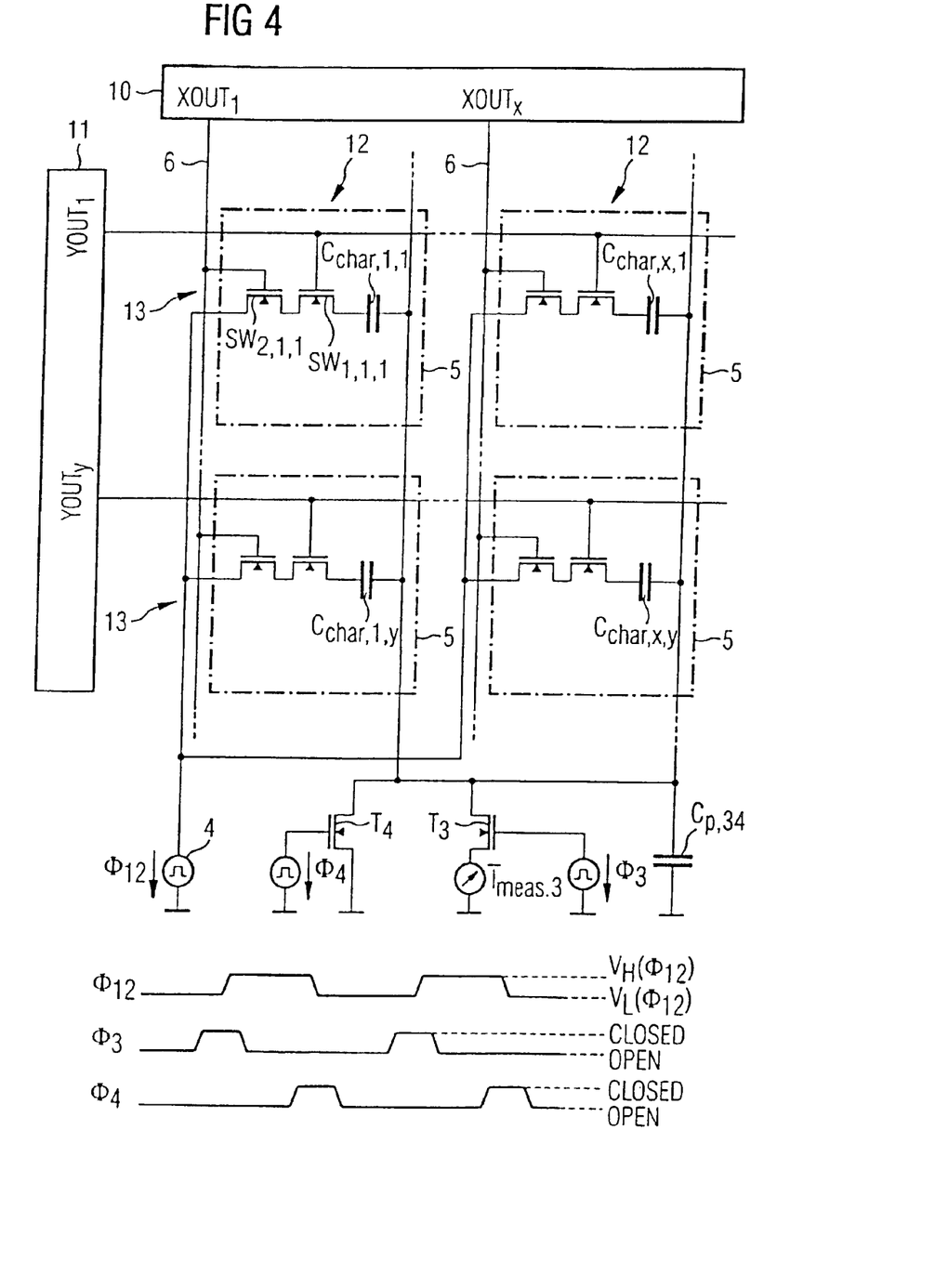
FIG. 4 is a fragmentary, schematic and block circuit diagram of another alternative embodiment of the circuit configuration according to the invention using AC voltage and a corresponding signal flow diagram.

FIG. 4 shows a further simplified embodiment of the present invention, in which the test arm 2 is fed with an AC voltage 4. Here, in each case one control switching element $SW_{1,x,y}$ (for the Y decoder 11) and $SW_{2,x,y}$ (for the X decoder 10) are just provided for each cell 5 for each dimension, and this is integrated in the test arm that leads to the capacitance $C_{char,x,y}$. Instead of the individual control switching elements, in this case transistors, it is also possible to use transfer gates (n in parallel with p), in which an n-MOS transistor and a p-MOS transistor in each case ensure that the full voltage can be formed. Based on the transistor technology that is used, the inverted outputs to $X_{out}$ and $Y_{out}$ are, once again, also required here for drive purposes.

As has already been discussed above, a mismatch between the transistors $T_3$ and $T_4$ can lead to a certain corruption of the measurement result. Parameter variations in all the other transistors that are used in FIGS. 2A, 2B, and 3 are not critical. Furthermore, a mismatch in the levels of the signals $\Phi_3$ and $\Phi_4$ can also be covered here, in the same way as a threshold voltage mismatch between the transistors $T_3$ and $T_4$, which is, then, likewise evident as a minor measurement error.

As in the case of the simple circuit shown in FIG. 1 as well, errors such as these can be compensated for completely by measuring an arm current twice using the non-inverted and inverted signal $\Phi_{12}$ and calculating the capacitance using equation (2a). Furthermore, the gate signals of $T_3$ and $T_4$ can also be buffered by inverters here, which lead to the two transistors having completely identical levels.

For the situation where capacitance ratios are intended to be assessed (for example, for investigations relating to capacitance matching), such compensation measures may, however, frequently be omitted even for high-precision requirements, as will be shown in the following discussion.

The following text investigates the situation in which the aim is to form the ratio $C_{char,1}/C_{char,2}$ of two capacitances with the values $C_{char,1} = \overline{C}_{char} + \frac{1}{2}\delta C_{char}$ and $C_{char,2} = \overline{C}_{char} - \frac{1}{2}\delta C_{char}$ using one of the circuits according to the invention.

The actual relative discrepancy between the capacitance values δr then becomes:

$$\delta r = \frac{C_{char,1} - C_{char,2}}{\frac{1}{2}[C_{char,1} + C_{char,2}]} = \quad (3)$$

$$\frac{\left(\overline{C}_{char} + \frac{1}{2}\delta C_{char}\right) - \left(\overline{C}_{char} - \frac{1}{2}\delta C_{char}\right)}{\frac{1}{2}\left(\overline{C}_{char} + \frac{1}{2}\delta C_{char}\right) + \left(\overline{C}_{char} - \frac{1}{2}\delta C_{char}\right)} = \frac{\delta C_{char}}{\overline{C}_{char}}$$

When calculating the measurement error for the capacitance ratio, it is necessary to remember that the measurement error $\Delta C_{char}$, which is governed by the parameter variations of $T_3$ and $T_4$ acts on $C_{char,1}$ and $C_{char,2}$ in the same way because the pair of transistors $T_3$ and $T_4$ occurs only once in the entire matrix, and is used for assessment of all the capacitances. The discrepancy $\Delta\delta r$, which indicates the difference between the actual value of δr and the value determined by measurement, is, thus, given by:

$$\Delta\delta r = \frac{(C_{char,1} + \Delta C_{char}) - (C_{char,2} + \Delta C_{char})}{\frac{1}{2}[(C_{char,1} + \Delta C_{char}) + (C_{char,2} - \Delta C_{char})]} - \delta r \quad (4a)$$

$$= \delta r\left(\frac{\overline{C}_{char}}{\overline{C}_{char} + \Delta C_{char}} - 1\right) \quad (4b)$$

$$= \delta r\left(\frac{1}{1 + \frac{\Delta C_{char}}{\overline{C}_{char}}} - 1\right) \quad (4c)$$

On the (appropriate) assumption that the measurement error $\Delta C_{char}/\overline{C}_{char}$ is small in comparison to 1, equation (4) can be written approximately as:

$$\Delta\delta r = \quad (5)$$

$$\delta r\left(\frac{1}{1 + \frac{\Delta C_{char}}{\overline{C}_{char}}} - 1\right) = \delta r\left(\left(1 - \frac{\Delta C_{char}}{\overline{C}_{char}}\right) - 1\right) = -\delta r \frac{\Delta C_{char}}{\overline{C}_{char}}$$

from which it follows that:

$$\frac{\Delta\delta r}{\delta r} = -\frac{\Delta C_{char}}{\overline{C}_{char}} \quad (6)$$

If, for example, the intention is to determine the capacitance ratio of capacitances whose mean value is 10 fF, and it is assumed that the maximum error $|(\Delta C_{char}/\overline{C}_{char})_{max}|$ is approximately 1%, this means that, for capacitances with discrepancies of, for example, ±0.1%(10.01 fF and 9.99 fF), ±1%(10.1 fF and 9.9 fF), or 10% (11 fF and 9 fF) that the values ±0.099%, ±0.99%, or ±9.9% are determined instead of the true results.

Thus, assuming that a configuration as shown in FIGS. 2A and 2B or FIG. 3 is used for assessment of capacitance ratios (in which case the relative scatter width of the measurement values $\sigma(C_{char}/\overline{C}_{char})$, that is to say, the absolute scatter width $\sigma(C_{char})$ normalized to the mean value $\overline{C}_{char}$ is frequently of interest), the error in this scatter width corresponds precisely to the measurement error $(\Delta C_{char}/\overline{C}_{char})$. of interest), the error in this scatter width corresponds precisely to the measurement error $(\Delta C_{char}/\overline{C}_{char})$.

An error such as this is negligible for virtually all applications of this type.

We claim:

1. A circuit configuration for assessing capacitances, comprising:
    a matrix in at least one dimension having rows each with at least one capacitance having first and second electrodes;
    a test arm connected to said first electrode of each of said at least one capacitance to be assessed, said test arm adapted to apply two different potentials to said first electrode;
    a measurement arm having first and second measurement paths each connected to a common potential, said first measurement path having an instrument for assessing said at least one capacitance, said measurement arm connected to said second electrode of each of said at least one capacitance to be assessed, said first and second measurement paths adapted to connect to said second electrode of each of said at least one capacitance; and
    a drive device connecting each of said at least one capacitance to said two different potentials for individually assessing each of said at least one capacitance.

2. The circuit configuration according to claim 1, wherein; said drive device has a configuration of switching paths for each dimension of said matrix;
    each of said rows with at least one capacitance is associated with at least one of said switching paths having at least one control switching element and a drive switching said at least one control switching element;
    said at least one control switching element is integrated in said test arm and selectively applies at least one of said two different potentials to said first electrodes of each of said rows with at least one capacitance.

3. The circuit configuration according to claim 2, wherein said switching paths of at least one dimension for each of said capacitance in one of said rows have at least one control switching element integrated in a part of said test arm leading to said capacitance.

4. The circuit configuration according to claim 2, wherein said switching paths of at least one dimension for each of said rows with at least one capacitance have at least one control switching element integrated in a part of said test arm leading to said row.

5. The circuit configuration according to claim 2, wherein:
    said drive device has an address decoder with an individually drivable output for each of said rows with at least one capacitance; and
    said drive has a signal line between each of said individually drivable output and said at least one control switching element.

6. The circuit configuration according to claim 2, wherein:
    said test arm has a first test path with a first switching element and a second test path with a second switching element for each of the capacitances, a first potential of said two different potentials being applied to said first test path and a second potential of said two different potentials being applied to said second test path; and
    said first test path and said second test path are connected through a node to said first electrode of each of said at least one capacitance.

7. The circuit configuration according to claim 6, wherein said switching paths in at least one dimension for each of said capacitance in one of said rows have a control switching element integrated in said first test path, and a control switching element integrated in said second test path.

8. The circuit configuration according to claim 7, wherein said switching paths in at least one dimension for each of said rows with at least one capacitance have a control switching element integrated in said first test path and a control switching element integrated in said second test path.

9. The circuit configuration according to claim 6, wherein said switching paths in at least one dimension for each of said rows with at least one capacitance have a control switching element integrated in said first test path and a control switching element integrated in said second test path.

10. The circuit configuration according to claim 6, including:
a third switching element connecting said first measurement path to said common potential; and
a fourth switching element connecting said second measurement path to said common potential.

11. The circuit configuration according to claim 10, wherein at least one of said first switching element, said second switching element, said third switching element, said fourth switching element, and said at least one control switching element is a transistor.

12. The circuit configuration according to claim 11, wherein said first switching element, said second switching element, said third switching element, said fourth switching element, and said at least one control switching element are to be provided with clock signals at least one of directly and indirectly driving said first switching element, said second switching element, said third switching element, said fourth switching element, and said at least one control switching element.

13. The circuit configuration according to claim 12, including a clock signal generator producing, from a master clock signal, said clock signals and a clock AC voltage.

14. The circuit configuration according to claim 16, wherein said first switching element, said second switching element, said third switching element, and said fourth switching element are to be provided with clock signals at least one of directly and indirectly driving said first switching element, said second switching element, said third switching element, and said fourth switching element.

15. The circuit configuration according to claim 14, including a clock signal generator producing, from a master clock signal, said clock signals and a clock AC voltage.

16. The circuit configuration according to claim 6, wherein said first switching element and said second switching element are to be provided with clock signals at least one of directly and indirectly driving said first switching element and said second switching element.

17. The circuit configuration according to claim 16, including a clock signal generator producing, from a master clock signal, said clock signals and a clock AC voltage.

18. The circuit configuration according to claim 6, wherein:
a common clock AC voltage is to be applied to said first switching element and said second switching element; and
said first switching element and said second switching element are to be switched alternately by the common clock AC voltage.

19. The circuit configuration according to claim 18, wherein said first switching element and said second switching element have a p-MOS and an n-MOS transistor to be switched alternately by the common clock AC voltage.

20. The circuit configuration according to claim 19, wherein said first switching element and said second switching element respectively have a p-MOS and an n-MOS transistor to be switched alternately by the common clock AC voltage.

21. The circuit configuration according to claim 18, including a clock signal generator producing, from a master clock signal, said clock signals and the common clock AC voltage.

22. The circuit configuration according to claim 1, including an AC voltage supply applying an AC voltage to said test arm.

23. The circuit configuration according to claim 22, wherein said AC voltage is a square-wave voltage.

24. The circuit configuration according to claim 1, wherein an AC voltage is applied to said test arm.

25. The circuit configuration according to claim 1, wherein said assessment instrument is an ammeter.

26. The circuit configuration according to claim 1, wherein said second measurement path has a second instrument for assessing said at least one capacitance independent of said assessment instrument.

27. The circuit configuration according to claim 1, wherein said common potential is equal to one of said two different potentials.

28. The circuit configuration according to claim 1, wherein:
one of said two different potentials is an operating voltage; and
another of said two different potentials is ground.

29. A circuit configuration for assessing capacitances, comprising:
a matrix in at least one dimension having rows each with at least one capacitance having first and second electrodes;
a test arm connected to said first electrode of each of said at least one capacitance to be assessed, said test arm adapted to apply two different potentials to said first electrode;
a measurement arm having first and second measurement paths each connected to a common potential, said first measurement path having an instrument for assessing said at least one capacitance, said measurement arm connected to said second electrode of each of said at least one capacitance to be assessed, said first and second measurement paths adapted to connect to said second electrode of each of said at least one capacitance; and
a means for connecting each of said at least one capacitance to said two different potentials and for individually assessing each of said at least one capacitance.

30. A method for assessing capacitances, which comprises:
providing a matrix in at least one dimension having rows each with at least one capacitance having first and second electrodes;
connecting a test arm to first electrodes of each of the capacitances to be assessed, the test arm adapted to apply first and second different potentials to the first electrodes;
providing a measurement arm having first and second measurement paths each connected to a common potential, the first measurement path having an instrument for assessing the capacitances;
connecting the measurement arm to second electrodes of each of the capacitances to be assessed, the first and second measurement paths adapted to connect to the second electrodes;
enabling individual assessment of each capacitance by connecting each capacitance to the first and second potentials through a drive device;
respectively charging and discharging the capacitances to be assessed by alternately applying the first potential and the second potential to the first electrode of the capacitance through the test arm and applying the common potential to the second electrode of the capacitance through the measurement arm; and
performing at least one assessment of the capacitance during one of the charging and the discharging of the capacitance in the measurement arm by:

connecting the second electrode of the capacitance to the common potential through the instrument for at least one assessment during one of the charging and the discharging of the capacitance in a first measuring path of the measuring arm with the common potential; and connecting the second electrode of the capacitance to the common potential through the second measurement path of the measurement arm during one of the discharging and the charging of the capacitance when the at least one assessment is not carried out.

31. The method according to claim 30, which further comprises activating the capacitance to be assessed in the matrix by switching on a part of the test arm leading to a specific capacitance.

32. The method according to claim 31, which further comprises carrying out the switching on of the part of the test arm with control switching elements integrated in the part of the test arm, at least one of the control switching elements being provided for each of the dimensions.

33. The method according to claim 31, which further comprises carrying out the switching on of the part of the test arm with control switching elements integrated in the test arm, at least one of the control switching elements being integrated in the part of the test arm for at least one of the dimensions, and at least one control switching element integrated in a part of the test arm for at least one of the dimensions leading to a row of capacitances and also associated with the part.

34. The method according to claim 30, which further comprises carrying out the assessment by measuring a current flow integral through the first measurement path of the measurement arm during one of the charging and the discharging of the capacitance.

35. The method according to claim 30, which further comprises:

not carrying out the at least one assessment during discharging if the capacitance is assessed during charging; and not carrying out the at least one assessment during charging if the capacitance is assessed during discharging.

36. The method according to claim 30, which further comprises not carrying out the at least one assessment during discharging if the capacitance is assessed during charging.

37. The method according to claim 30, which further comprises not carrying out the at least one assessment during charging if the capacitance is assessed during discharging.

38. The method according to claim 30, which further comprises, during periods when the at least one assessment is not carried out, applying the common potential to the second electrode through the second measurement path of the measurement arm.

39. The method according to claim 30, which further comprises carrying out the assessment of the capacitance to record one of an entire charging process and an entire discharging process.

40. The method according to claim 30, which further comprises carrying out the assessment of the capacitance such that one of the entire charging process and the entire discharging process is recorded.

41. The method according to claim 30, which further comprises, during periods when the at least one assessment is not carried out, carrying out a second assessment of the capacitance during one of the discharging and the charging.

42. The method according to claim 41, which further comprises carrying out the second assessment of the capacitance with a second measurement instrument integrated in the second measurement path of the measurement arm.

43. The method according to claim 30, which further comprises carrying out the alternating application of the first and second potentials by applying an AC voltage to the test arm.

44. The method according to claim 30, which further comprises carrying out the alternating application of the first and second potentials by alternating connection of a first test path at the first potential and of a second test path at the second potential to the first electrode.

45. The method according to claim 44, which further comprises carrying out the alternating connection with switching elements integrated in the first and second test paths.

46. The method according to claim 30, which further comprises alternately connecting the first measurement path and the second measurement path to the second electrode.

47. The method according to claim 46, which further comprises carrying out the alternating connection with switching elements integrated in the first and second measurement paths.

48. The method according to claim 30, which further comprises improving an accuracy of determining the capacitance from two assessments by interchanging a time correlation between an application of the first and second potentials and the at least one assessment during one of charging and discharging, and renewing assessment of the capacitance in the measurement arm.

49. The method according to claim 30, which further comprises:

interchanging a time correlation between an application of the first and second potentials and the at least one assessment during one of charging and discharging;

renewing an assessment of the capacitance in the measurement arm; and more accurately determining the capacitance from the two assessments.

* * * * *